(12) United States Patent
Boerstler et al.

(10) Patent No.: US 7,760,843 B2
(45) Date of Patent: Jul. 20, 2010

(54) HIGH FREQUENCY DIVIDER STATE CORRECTION CIRCUIT

(75) Inventors: David William Boerstler, Round Rock, TX (US); Eric John Lukes, Stewartville, MN (US); Hiroki Kihara, Austin, TX (US); James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/187,517

(22) Filed: Aug. 7, 2008

(65) Prior Publication Data

US 2008/0301503 A1 Dec. 4, 2008

Related U.S. Application Data

(62) Division of application No. 11/467,972, filed on Aug. 29, 2006, now Pat. No. 7,453,293, which is a division of application No. 10/850,400, filed on May 20, 2004, now Pat. No. 7,119,587.

(51) Int. Cl.
  *H03K 21/00* (2006.01)
(52) U.S. Cl. .......................... 377/47; 377/48; 327/115; 327/117
(58) Field of Classification Search .................. None
  See application file for complete search history.

(56) References Cited

U.S. PATENT DOCUMENTS

| | | | |
|---|---|---|---|
| 3,530,284 A | 9/1970 | Wood | |
| 3,609,391 A * | 9/1971 | Hatano et al. | 327/176 |
| 4,442,748 A | 4/1984 | Kaneko et al. | |
| 4,691,331 A * | 9/1987 | Bayruns et al. | 377/47 |
| 4,993,051 A | 2/1991 | Feldbrugge | |
| 5,195,111 A * | 3/1993 | Adachi et al. | 377/52 |
| 5,339,345 A | 8/1994 | Mote, Jr. | |
| 5,425,074 A * | 6/1995 | Wong | 377/47 |
| 5,526,390 A * | 6/1996 | Fucili | 377/29 |
| 5,948,046 A * | 9/1999 | Hagberg | 708/103 |
| 6,072,849 A * | 6/2000 | Sessions | 377/28 |
| 6,531,903 B1 | 3/2003 | Wichman | |
| 6,661,864 B2 * | 12/2003 | Ishiwaki | 377/28 |
| 6,826,250 B2 | 11/2004 | Groo | |
| 7,113,009 B2 * | 9/2006 | Sun et al. | 327/115 |
| 2002/0114422 A1 | 8/2002 | Ishiwaki | |

* cited by examiner

*Primary Examiner*—Tuan Lam
(74) *Attorney, Agent, or Firm*—Matthew B. Talpis; Gregory K Goshorn; Greg Goshorn, P.C.

(57) ABSTRACT

The present invention provides for a self-correcting state circuit. A first flip flop is configured to receive a clock input and a first data input, and to generate a first output in response to the clock input and the first data input. A second flip flop is coupled to the first flip flop and configured to receive the clock input and to receive the first output as a second data input, and to generate a second output in response to the clock input and the first output. A first correction circuit is coupled to the second flip flop and configured to generate a corrected output. A third flip flop is coupled to the first correction circuit and configured to receive the clock input and to receive the corrected output as a third data input, and to generate a third output in response to the clock input and the third data input.

6 Claims, 6 Drawing Sheets

HIGH FREQUENCY DIVIDER STATE CORRECTION CIRCUIT

CROSS-REFERENCE TO RELATED APPLICATIONS

This application is a division of, and claims the benefit of the filing date of, U.S. patent application Ser. No. 11/467,972 entitled HIGH FREQUENCY DIVIDER STATE CORRECTION CIRCUIT, filed Aug. 29, 2006, now U.S. Pat. No. 7,453,293 which is a division of U.S. patent application Ser. No. 10/850,400 entitled HIGH FREQUENCY DIVIDER STATE CORRECTION CIRCUIT, now U.S. Pat. No. 7,119,587 filed May 20, 2004. This application relates to U.S. patent application Ser. No. 10/850,402 entitled HIGH FREQUENCY DIVIDER STATE CORRECTION CIRCUIT WITH DATA PATH CORRECTION, now U.S. Pat. No. 7,061,284, filed May 20, 2004.

TECHNICAL FIELD

The present invention relates generally to error correction and, more particularly, to error correction in a state machine circuit.

BACKGROUND

There is a type of incrementer called a high frequency divider. In a high frequency divider, the values within the incrementer change in a predefined fashion, but not necessarily by a mathematical addition or subtraction. For example, 000000 could be the first state, 000001 could be the second state, 000011 could be the third, 000111 could be the fourth, 001111 could be the fifth, 011111 could be the sixth, 111111 could be the seventh, 011111 could be the eighth state, and so on. The values could represent the generation of a square wave, although other uses are also possible. The particular transition from state value to state value is a function of the internal logic of the high frequency divider.

However, there is a problem with typical high frequency dividers. One such problem is if the system starts up in an invalid state. In the example above, for instance, the state 010101 is not a desired state, but is physically accessible at start up. This can happen when a system first powers up, as the states of the latches within the system can be indeterminate. Alternatively, a catastrophic event, such as an electromagnetic pulse, for example, can disrupt the latches or other system components. If this happens, the high frequency divider can be forced into an undesired state.

Moreover, if left uncorrected in conventional systems, the states could cycle from one undesired state to another undesired state, without ever becoming a desired state and getting back on track. In some conventional systems, the system can be reset, and a preloaded "seed" state can be entered into the system. However, this is an expensive proposition, time-wise, and errors can creep in if the initial "seed" state is somehow inaccurate. Further, if an electromagnetic pulse changes the state within the circuit to an invalid state or sequence, this invalid state or sequence should be deleted, which costs additional time and circuitry area, and a system reset is issued, which also costs additional time.

Therefore, there is a need to ensure that a desired state is arrived at after a certain number of state transitions in a manner that addresses at least some of the problems associated with the prior art.

SUMMARY OF THE INVENTION

The present invention provides for a self-correcting state circuit. A first flip flop is configured to receive a clock input and a first data input, and to generate a first output in response to the clock input and the first data input. A second flip flop is coupled to the first flip flop and configured to receive the clock input and to receive the first output as a second data input, and to generate a second output in response to the clock input and the first output. A first correction circuit is coupled to the second flip flop and configured to generate a corrected output. A third flip flop is coupled to the first correction circuit and configured to receive the clock input and to receive the corrected output as a third data input, and to generate a third output in response to the clock input and the third data input.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1A:
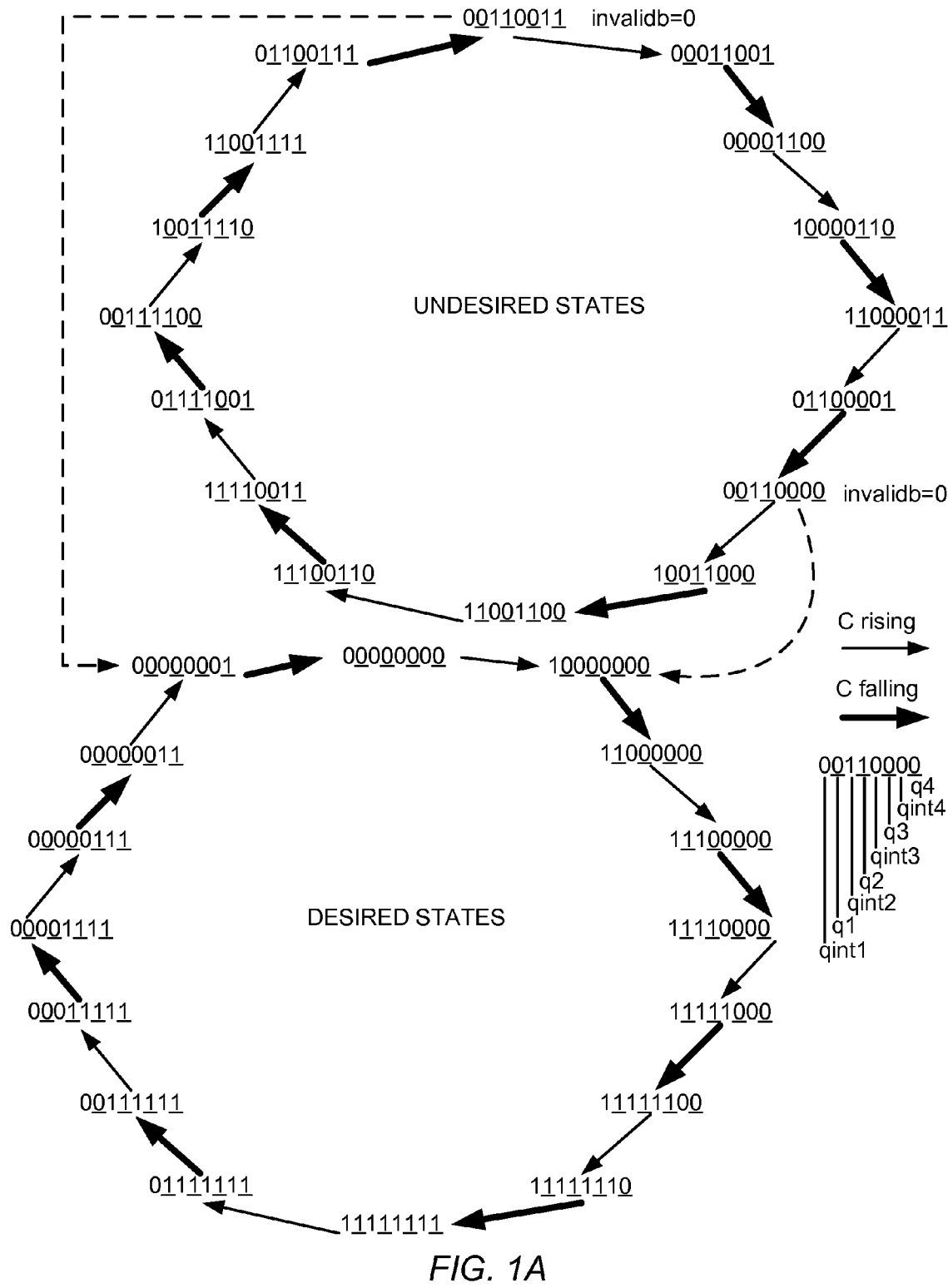
FIG. 1A schematically depicts an allowed and an unallowed divide by 8 stateflow.

Turning to FIG. 1A, disclosed is a stateflow diagram illustrating an exemplary stateflow with designated allowed or "desired" and unallowed or "undesired" states. Generally, FIG. 1A illustrates a plurality of pre-determined desired states following an ordered sequence according to a pre-determined transition rule and a plurality of pre-determined undesired states following an ordered sequence according to the pre-determined transition rule.

In FIG. 1A, an unallowed stateflow transitions into an allowed stateflow after one of a plurality of specifically defined states or a set of states occurs. That is, one or more of the undesired states are selected and correlated to one or more of the desired states. Generally, as shown in FIG. 1A, a specifically defined non-allowed state is detected, such as 00110011 or 00110000, and an internal change of a value occurs within the high frequency divider circuit, thereby initiating a state change into a particular desired state, such as 00000001 or 10000000. In a conventional system, the detected non-allowed state would transition to, for example, 00011001 or 10011000.

For example, assume the undesired state "01100111" arose at power up, using conventional technology. By the internal logic of the circuitry (a shift right, or bitwise right circular shift, and then invert the value shifted from the rightmost bit and wrapped around the to the leftmost bit), "01100111" would transition to "00110011", which is another unallowed state. Similarly, "00110011" would transition to "00011001", also another unallowed state, and so forth. The present invention, as illustrated through the transition diagram of FIG. 1A, addresses this problem.

Figure 1B:
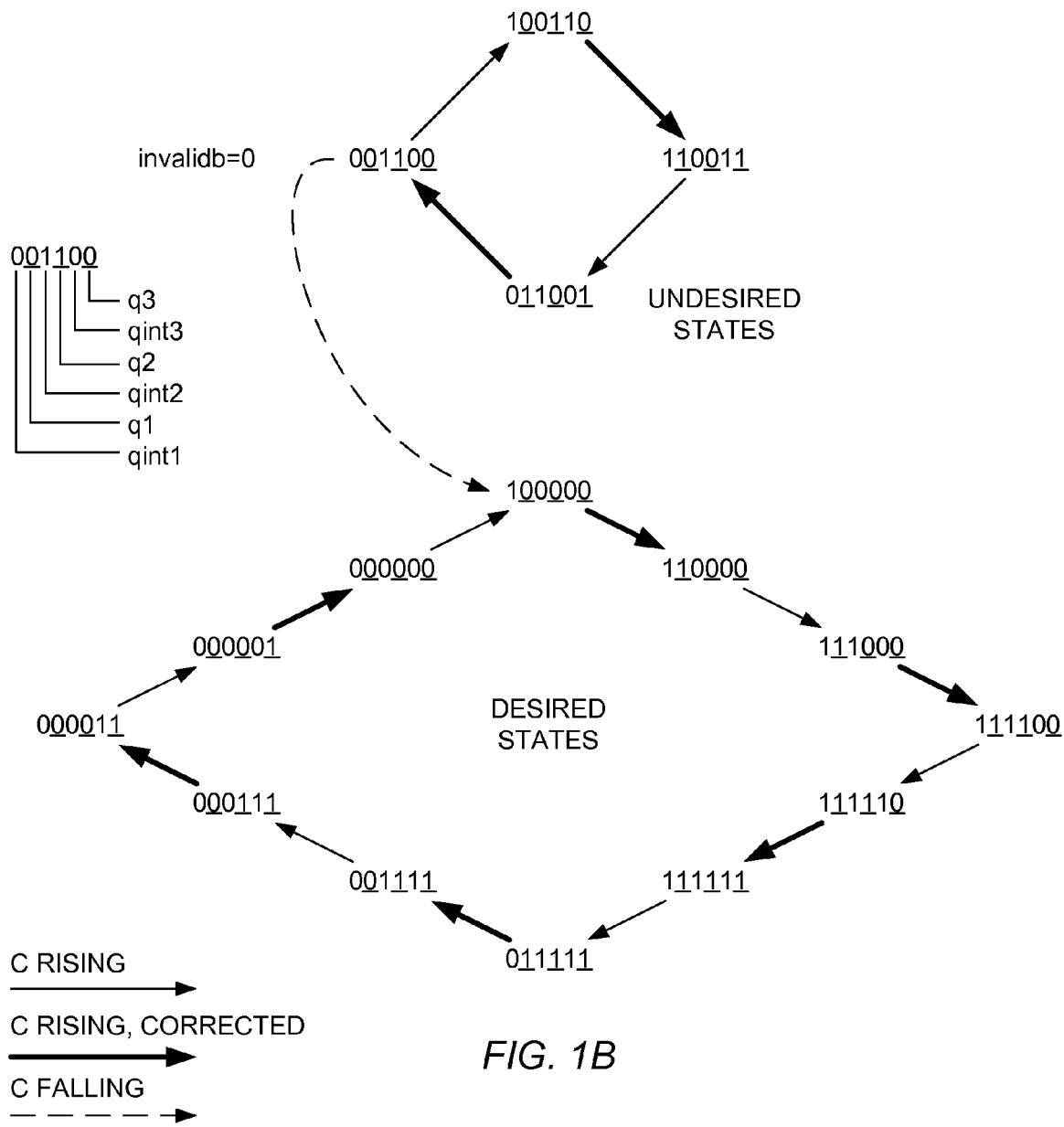
FIG. 1B schematically depicts an allowed and an unallowed divide by 6 stateflow.

Turning now to FIG. 1B, disclosed is a stateflow diagram illustrating a "divide by 6" stateflow with designated allowed or "desired" and unallowed or "undesired" states. An undesired state transitions into an allowed state from a specifically defined undesired state. Generally, as shown in FIG. 1B, the particular specifically defined undesired state is "001100", from which a circuit transitions to the allowed state "100000". In conventional technology, the circuit would transition from "001100" to "100110", which is another undesired state.

Figure 2:
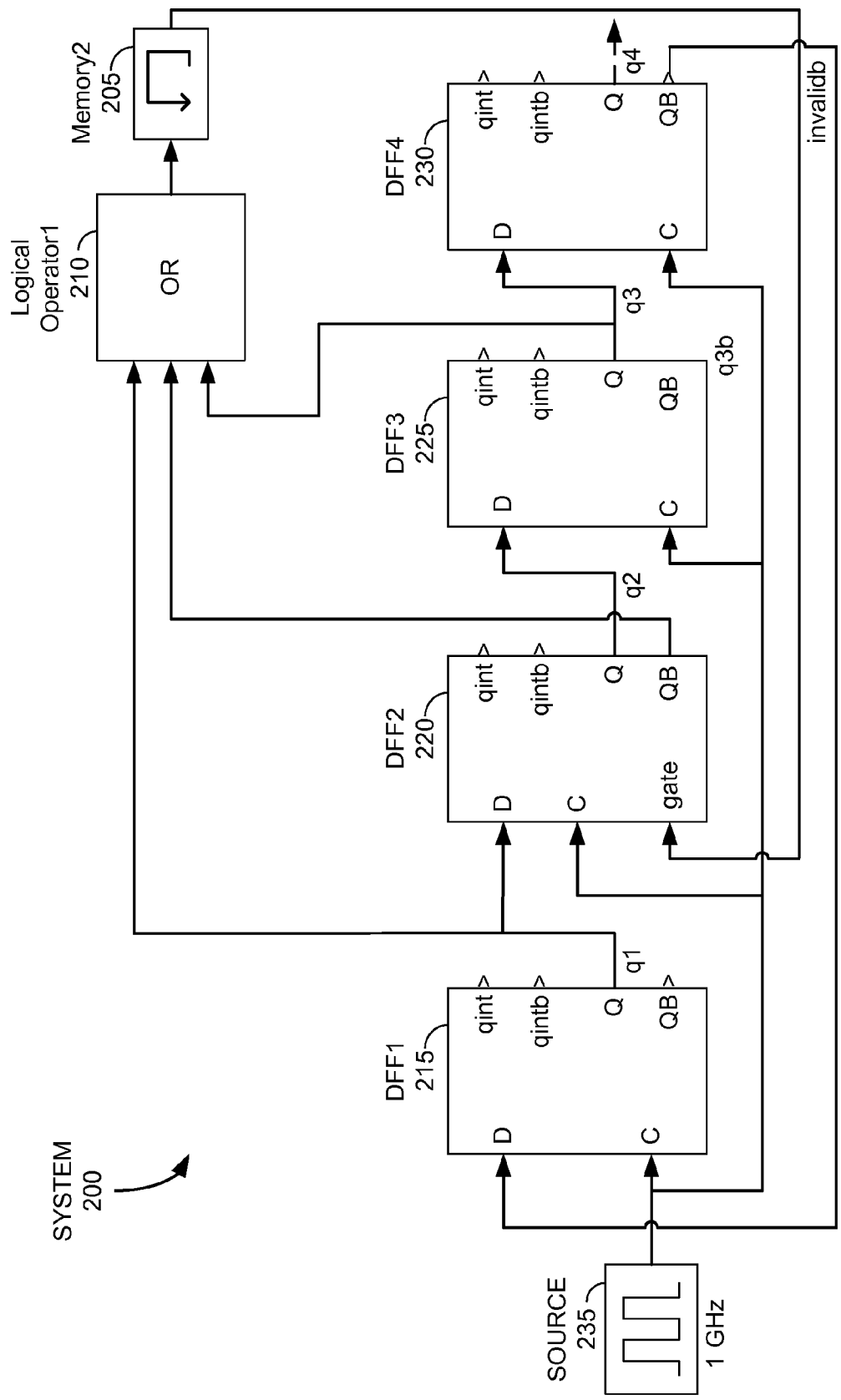
FIG. 2 illustrates a divide by 8 stateflow correction circuit with state correction.

Turning now to FIG. 2, illustrated is a divide by 8 state circuit 200. A D type flip flop (DFF) 1 215 has a clock signal input into its C input from a clock source 235. The Q output of DFF1 215 (q1 signal state) is coupled to the D input (the data input) of a DFF2 220. The Q output of DFF2 220 (q2 signal state) is coupled to the D input of a DFF3 225. The Q output of DFF3 225 (q3 signal state) is coupled to the D input of a DFF4 230. The Q-inverted output (QB) of DFF4 230 (q4 signal state) is fed back into and coupled to the D input of DFF1 215.

The Q states of DFF1 215, DFF2 220, DFF3 225, and DFF4 230 are coupled to a logical operator 1 210. The logical operator 1 210 is coupled to a gate of the DFF2 220. In other implementations, only flip flops 215, 220, and 225 are used. In the illustrated embodiment, logical operator 1 210 is coupled to DFF2 220 through Gate Memory 205. As shown, Gate Memory 205 is configured to introduce a time delay, which helps prevent problems with substantially simultaneous feedback, which could cause the logic states not to converge, an error condition. The illustrated configuration supports the state transition from the undesired states to desired states of FIG. 1A.

Figure 3:
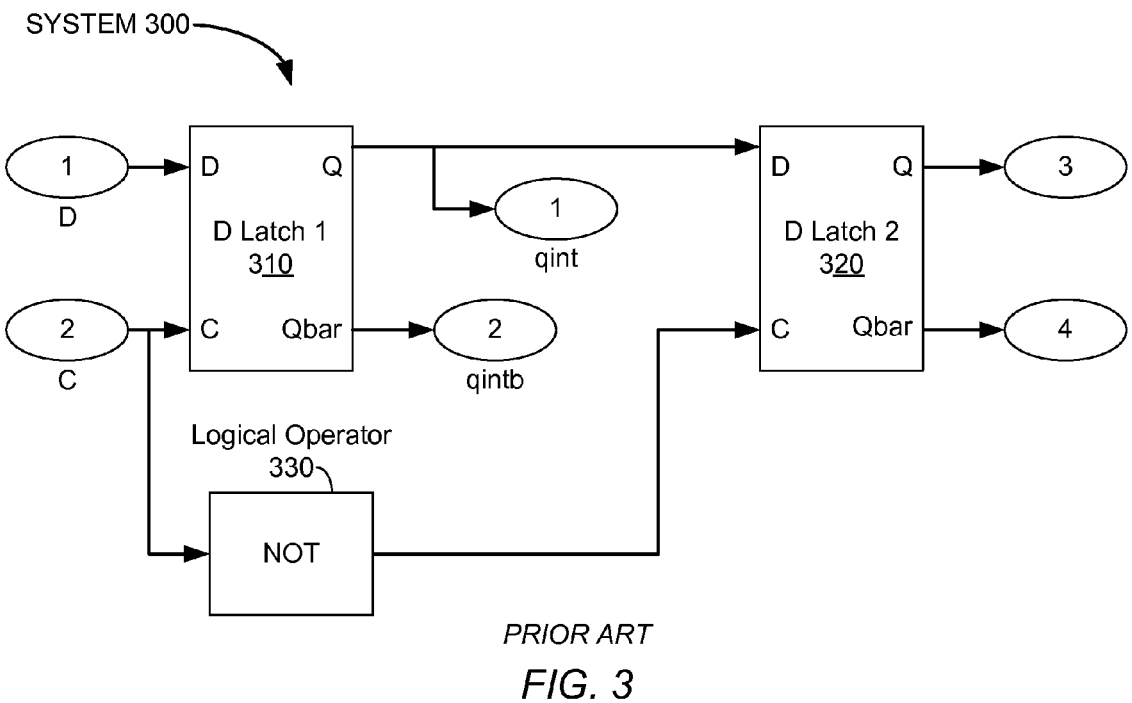
FIG. 3 illustrates a conventional D flip flop.

Turning now to FIG. 3, depicted is a system illustrating conventional D-type flip flops, such as DFF1 215, DDF3 225, and DFF4 230 of FIG. 2, for example, generally indicated by the reference numeral 300. Flip flops have applicability as memory devices. In the illustrated system, there are two inputs for the flip flop, input 1 (D, for data input) and input 2 (C, for a clock input). The flip flops DFF1 215, DFF3 225, and DFF4 230 shown in FIG. 2 are depicted in greater detail in FIG. 3, and are comprised of 2 different latches, 310 and 320. Flip flop DFF2 220 will be described in greater detail below with respect to FIG. 4.

As is understood by those of skill in the art, if a flip flop is enabled by a clock signal, the flip flop will pass on the signal data state from the input to the output on the data, or Q line. However, if the flip flop is disabled by a clock signal, the input D value will not be propagated to the output, and instead the previously stored D value will be output.

As illustrated in FIG. 3, there are two D-type latches coupled in series, latch 310 and latch 320. If the input value for D is 1, and the clock value is enabled, the qint value is also the same as the D value, and the qintb value is the inverted value of qint. However, due to a logical "not" operator 330, the second D latch 320 is disabled. This means that, no matter what the qint value is in this circuit, the previous qint value is what is output as the Q value (as output 3). In other words, when the clock is "high", the output of system 300 does not change, as it "remembers" and outputs the previous state.

However, for example, in the next clock pulse, the input clock pulse goes "low". Therefore, the input data does not propagate from the Data input to the Q or qint output in this flip flop, and the qint value of the previous clock cycle is retained by this first D latch 310. However, because the input clock value is inverted to "high", the second flip flop propagated the qint value into the output Q, the "3" value. Hence, for the DFF1 215 to change an output state, it takes at least one full clock cycle, and it only accepts as input data states from alternating clock cycles.

Turning back to FIG. 2, this means that, for instance, the values 0<u>0000</u>011 can be used in the system. On the next clock cycle, the value becomes 0<u>0000</u>001. As has been explained above, there is an internal state (qint1, qint2, qint3) etc, which is illustrated as non-underlined, and a state q1, q2, q3 and so on, which is illustrated as underlined. The state changes because the inversion that occurs at the output of DFF4 230, which is fed back in as data into the D port of the DFF1 215. As is seen by the desired states transition illustrated in FIG. 1A, the states are stepped through the system, the last flip-flop inverting and transferring the inverted value back to the input.

However, if an undesired state comes up, the system 200 operates as follows. For example, consider a scenario wherein a conventional system starts as 01100111 as its starting state. A conventional system would then transition to 00110011, also an invalid state. Without correction the conventional system would further transition to 0<u>0011</u>001.

However, the logic of FIG. 2 is configured to transition to 0 <u>0000</u>001, an allowed state, instead of 0<u>0011</u>001, an non-allowed state. As shown in FIG. 2, the second bit of the state 00xxxxxx, is used to overwrite the next 3 bits in the state, to become 0<u>0000</u>xxx. Similarly, an invalid state of 00110000 transitions to 1<u>0000</u>000 instead of 1<u>0011</u>000. In other words, the first output state (q1) also becomes q2 internal and q2 out and q3 internal, as illustrated in FIG. 1A.

System 200 detects invalid states as follows. The outputs q1, q2 (inverted) and q3 are input into logical operator 1 210.

In the illustrated embodiment, logical operator 1 210 is an OR gate. When xxxxxxxx ("x" a variable), have the values of x0x 1x0xx, the OR gate 210 output becomes negative, the output invalid b state goes low, and there is enabled a transition from an unallowed state to an allowed state. Turning briefly to FIG. 1A, this transition happens at both 00110011 and 00110000, as is shown in FIG. 1A, and only in those states does the transition to a desired state happen.

Figure 4:
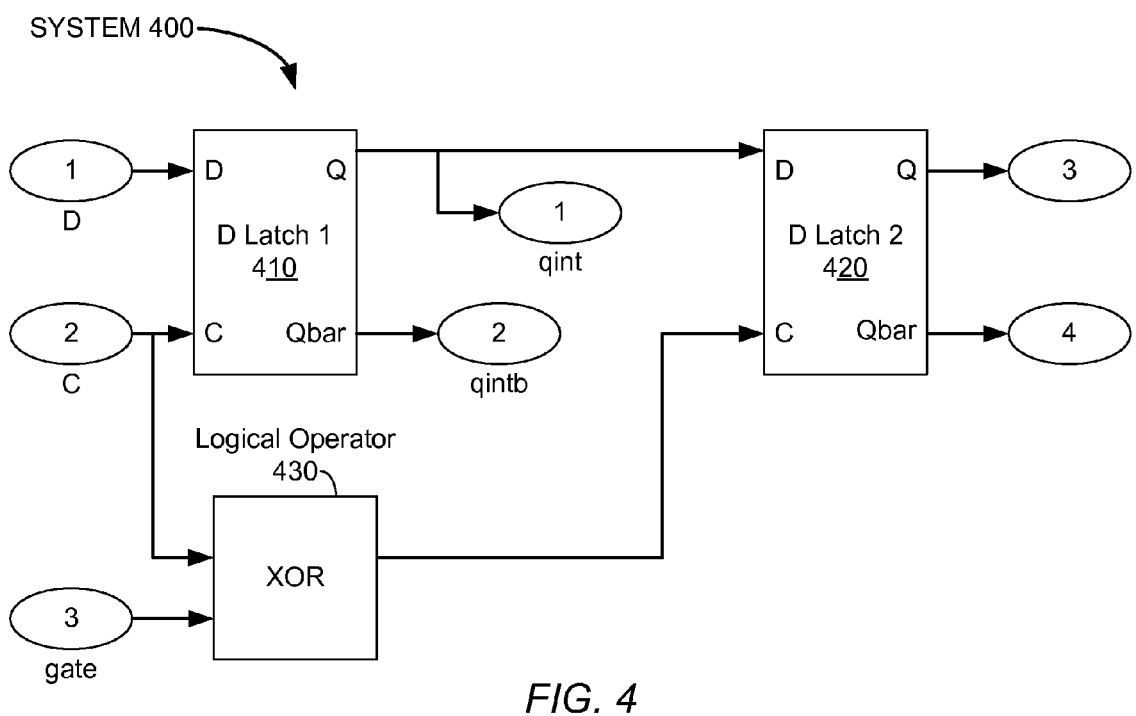
FIG. 4 illustrates a D flip flop configured for error correction.

Turning now to FIG. 4, depicted is a system illustrated a D-type flip flop such as, for example, DFF2 220 of FIG. 2, generally indicated by reference numeral 400. In particular, system 400 includes latches 410, 420 of a DFF2 220, the flip flop in which state transitions occur when the logical operator 1 210 detects a specified error state condition. The logical operator NOT (the inverter) 330 shown in FIG. 3 is replaced by an XOR (exclusive OR) 430 in FIG. 4. System 400 also receives an input 3 "gate" input to XOR 430. An XOR, as is understood by those of skill in the art, gives a true value if both values are different, and a false value (value of zero) if both input values are the same In the context of FIG. 2, this means that the OR output is 0 for a specific predefined non-allowed state, and 1 for an allowed state or a non-specified non-allowed state. Then, this becomes the "gate" value 3 into system 400, the DFF2 220 flip flop. As shown in FIG. 4, when the gate value output by the OR gate 210 is "1", and the C value input is a "1", the output value of XOR 430 is a "0", which means that system 400 is behaving like a prior art flip flop, and the XOR is behaving as an inverter. Similarly, if the gate value is "1" and the C value input is a "0", the output value is a "1", which means the XOR 430 is behaving as an inverter to the C value.

In FIG. 4, when the gate value is "0", and the C value input is a "1", the XOR 430 output value is a "1", which means that system 400 is not behaving like a prior art flip flop, and the same value for D is being propagated through both D1 latch 1 410 and D Latch 2 420. Similarly, if the gate value is "0" and the C value input is a "0", the XOR 430 output value is a "0", which is sent as a C input to D Latch 2 420, and the previous states are stored in D latch 1 410 and D latch 2 420.

In other words, when the output of OR 210, the gate input to XOR 430, is zero, the D latch 1 410 and the D latch 2 420 both have the same clock values within DFF2 220. In the context of FIG. 2, this means that when input 3 of FIG. 4 is "0", for a negative clock pulse, the qint value still does not change. However, unlike the prior art, the Q output value does not change either. Therefore, the qint and the q value are both "locked," which is unlike FIG. 3, and the Q output value does not change.

Furthermore, if the input clock pulse is positive and the gate input is zero, the input D value propagates through both D latches 410, 420, through qint2 and then out through Q. Also, because the clock state is positive as input into DFF3 225, the qint of the third flip flop q3*int* is also equal to q2. In other words, the D value becomes Q, which was not true in the prior art.

In other words, for a gate value of 0, and a positive clock cycle, the q1 value gets propagated to the qint2 value and the q2 output value, and the q3*int* value. In the context of FIG. 1A, this means that instead of 00110000 becoming the unallowed state of 10011000, it becomes 10000000, thereby forcing the system from an undesired state to a desired state. Likewise, the state after 00110011, which would have been 0 0011001, is instead 00000001, as the q1 value gets propagated and copied through to q3*int*.

Figure 5:
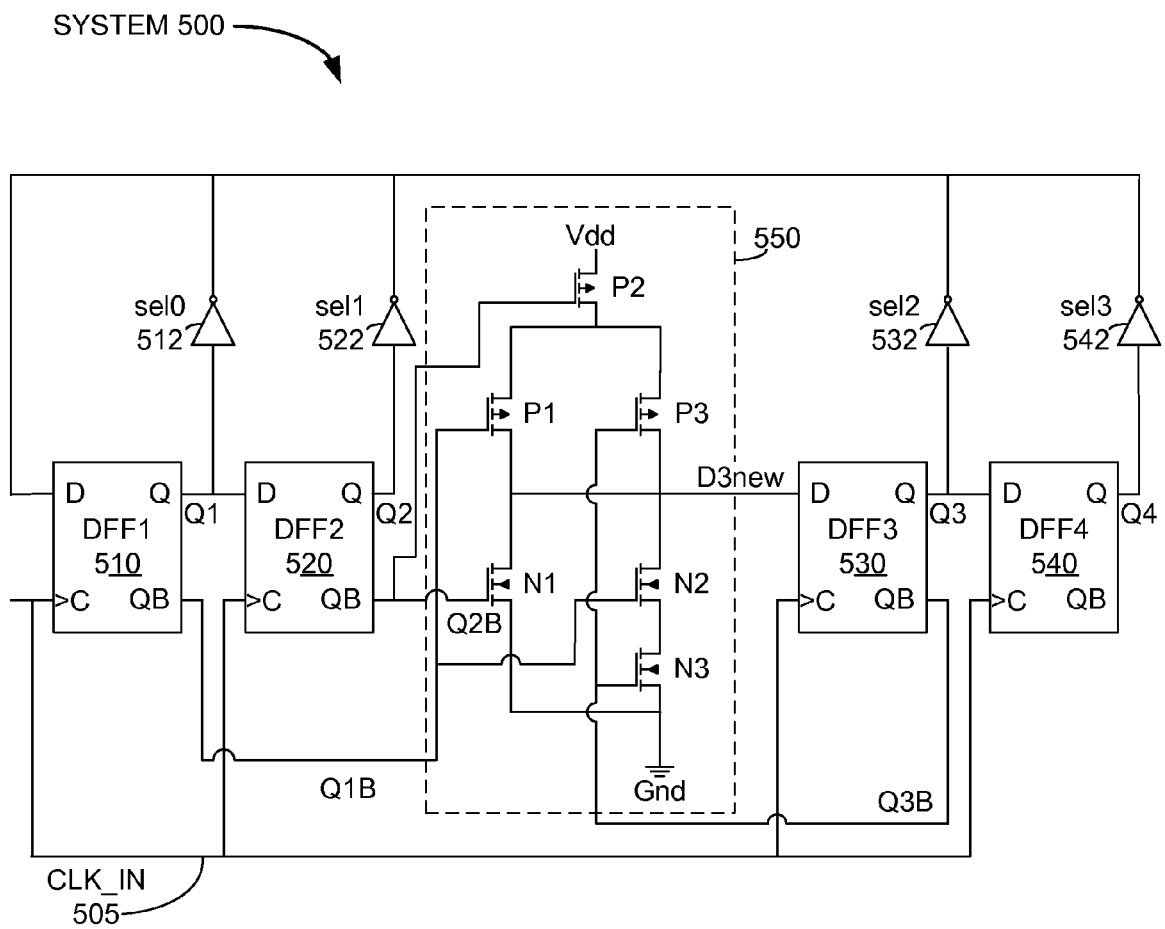
FIG. 5 illustrates an alternative embodiment of a divider circuit.

Turning now to FIG. 5, illustrated is an alternative embodiment of a divider circuit, generally indicated by the reference numeral 500. A D type flip flop (DFF) 1 510 has a clock signal input into its C input. The Q output of DFF1 510 (q1 signal state) is coupled to the D input (the data input) of a DFF2 520. The Q inverted output of DFF2 520 (q2*b* signal state) is coupled to a circuit 550. The output of the circuit 550 is coupled to the D input of a DFF3 530. The Q output of DFF3 530 (q3 signal state) is coupled to the D input of a DFF4 540. The outputs q1, q2, q3 and q4 can be selected by selectors 512, 522, 532, 542, thereby configuring the circuit 500 as a divide by 2, 4, 6 or 8 correction circuit.

A divider correction circuit 550 is coupled between the Q inverted output of DFF2 520 (q2*b*) and the data input into DFF3 530. As illustrated, divider correction circuit 550 is shown as a particular arrangement of p-type metal oxide semiconductor (PMOS) and n-type metal oxide semiconductor (NMOS) devices coupled between a supply voltage, Vdd and ground. As is understood by those of skill in the art, the voltage produced by a CMOS circuit is a function of a supply voltage, and which transistors of the CMOS circuit are turned on and off. Correction circuit 550 is one embodiment of logic implementing the truth table of Table 1 below. One skilled in the art will understand that the particular arrangement of PMOS/NMOS devices is exemplary and not intended to be limiting to only that arrangement.

TABLE 1

Truth Table for Correction Circuit 550.

| Q1b | Q2b | Q3b | D3new |
|---|---|---|---|
| 0 | 0 | 0 | 1 |
| 0 | 0 | 1 | 1 |
| 0 | 1 | 0 | 0 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

Table: CMOS Logic

In the above truth table, q1*b* (inverted output of DFF1 510), q2*b* (inverted output of DFF2 520), and q3*b* (inverted output of DFF3 530) are employed. As shown in FIG. 5, the circuit 550 is coupled between the inverted output of q2*b* and the data input into DFF3 530, designated as the D3new value. Circuit 550 operates substantially as follows.

As shown in FIG. 5, the q1*b* value, the q2*b* value, and the q3*b* value are inputs into divider correction circuit 550. If q1*b* is a zero, D3new equals the inverse of q2*b* (i.e., D3new equals q2). Where q1*b* is a zero, the state of q3 or q3*b* is not a factor in determining D3new.

However, if q1*b* equals a one, and if q2*b* equals a zero, and if q3*b* equals zero, then D3new is set to equal one. If q1*b* equals a one, and either q2*b* or q3*b* also equal a one, D3new is set to equal zero. Hence, error correction arises.

Furthermore, there is no state among the desired states that would create a "skip" to an undesired state. For instance, if q1 and q3 equal zero of a desired state, this would be x0xxx0xx By definition of the truth table of FIG. 5, this would then become x0x0x0xx. In other words, if q1 and q3 are zero, then q2 is automatically zero. Thus, there is no state that creates a problem.

Figure 6:
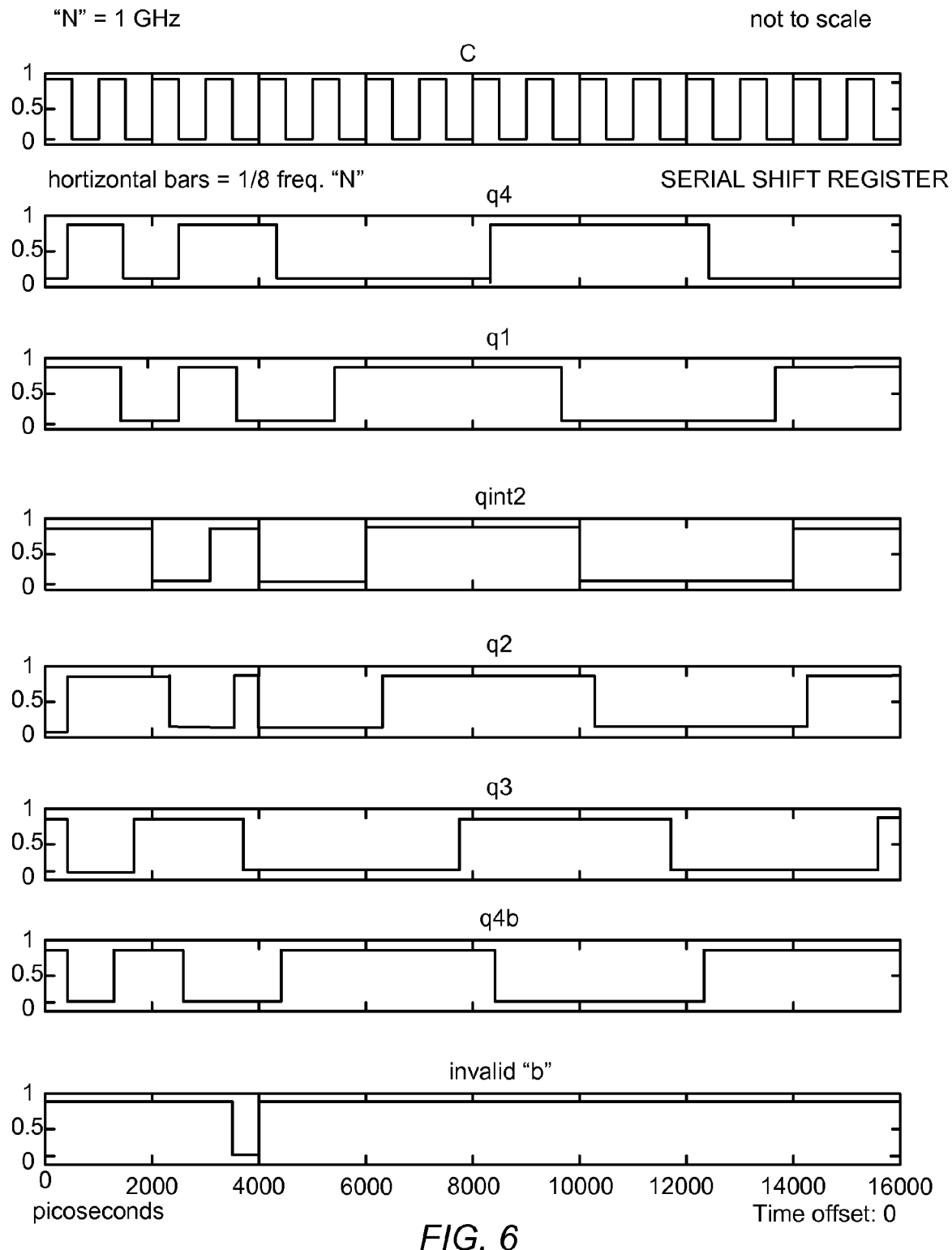
FIG. 6 illustrates various timing diagrams of external and internal state values of the flip flops of FIG. 2.

Turning now to FIG. 6, illustrated are simulated waveform diagram of the operation of the diagram. As is illustrated, even if a q1 to q4 waveform starts out in an incorrect state, it transitions into a correct sequence of 1s and 0s after a few clock transitions.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for state correction in a frequency divider state circuit, comprising:
   identifying a plurality of pre-determined desired states following an ordered sequence according to a predetermined transition rule;
   identifying a plurality of pre-determined undesired states following the ordered sequence according to the predetermined transition rule;
   selecting at least one of the plurality of predetermined undesired states;
   generating an error signal based upon an internal clock signal and an indication of a detection of an error state;
   correlating the selected at least one of the plurality of pre-determined undesired states with one of the plurality of pre-determined desired states; and
   transitioning from the selected undesired state to the correlated desired state, and not to the next undesired state according to the predetermined transition rule in response to the error signal.

2. The method of claim 1, further comprising:
   selecting at least two of the plurality of predetermined undesired states;
   correlating each of the at least two of the plurality of pre-determined undesired states with a unique one of the plurality of predetermined desired states; and
   transitioning from one of the at least two selected undesired states to the desired state correlated to that selected undesired state, and not to the next undesired state according to the pre-determined transition rule.

3. The method of claim 1, wherein the pre-determined transition rule comprises:
   a bitwise right circular shift operation; and
   wherein a rightmost bit is inverted as it is transferred into a leftmost position as a result of the right circular shift operation.

4. A frequency divider state circuit, comprising:
   a clock;
   a plurality of flip flops, coupled to the clock, configured for:
      identifying a plurality of pre-determined desired states following an ordered sequence according to a predetermined transition rule;
      identifying a plurality of pre-determined undesired states following the ordered sequence according to the predetermined transition rule;
      selecting at least one of the plurality of predetermined undesired states;
      generating an internal clock signal based upon a signal from the clock;
      generating an error signal based upon internal clock signal and an indication of a detection of an error state;
      correlating the selected at least one of the plurality of predetermined undesired states with one of the plurality of predetermined desired states; and
      transitioning from the selected undesired state to the correlated desired state, and not to the next undesired state according to the pre-determined transition rule in response to the error signal.

5. The frequency divider state circuit of claim 4, the plurality of flip flops further configured for:
   selecting at least two of the plurality of predetermined undesired states;
   correlating each of the at least two of the plurality of pre-determined undesired states with a unique one of the plurality of predetermined desired states; and
   transitioning from one of the at least two selected undesired states to the desired state correlated to that selected undesired state, and not to the next undesired state according to the pre-determined transition rule.

6. The frequency divider state circuit of claim 4, wherein the predetermined transition rule comprises:
   a bitwise right circular shift operation; and
   wherein a rightmost bit is inverted as it is transferred into a leftmost position as a result of the right circular shift operation.

* * * * *